(12) United States Patent
Kang et al.

(10) Patent No.: US 7,317,238 B2
(45) Date of Patent: Jan. 8, 2008

(54) INTRINSIC DECOUPLING CAPACITOR

(75) Inventors: Jung S. Kang, Chandler, AZ (US);
Peter P. Jeng, Phoenix, AZ (US);
Michael M. DeSmith, Beaverton, OR (US); Md Monzur Hossain, Chandler, AZ (US); Yi-feng Liu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 318 days.

(21) Appl. No.: 11/064,807

(22) Filed: Feb. 23, 2005

(65) Prior Publication Data

US 2006/0189059 A1 Aug. 24, 2006

(51) Int. Cl.
*H01L 29/00* (2006.01)
(52) U.S. Cl. .................. 257/534; 257/371; 257/204
(58) Field of Classification Search ................ 257/534, 257/371, 379, 204
See application file for complete search history.

(56) References Cited

U.S. PATENT DOCUMENTS 3,544,862 A * 12/1970 Gallagher et al. .......... 257/534
4,017,885 A * 4/1977 Kendall et al. ............. 257/534

* cited by examiner

*Primary Examiner*—Mark V. Prenty
(74) *Attorney, Agent, or Firm*—Blakely, Sokoloff, Taylor & Zafman LLP

(57) ABSTRACT

A plurality of N-doped strip portions are formed alternating with a plurality of P-doped regions. When a voltage is applied to the N-doped strip portions, a capacitance is created between the N-doped strip portions and the P-doped strip portions. A capacitance is also created between the N-doped strip portions and the underlying epitaxial silicon layer. A larger interface area between N-doped and P-doped regions generally increases the capacitance. By providing the N-doped strip portions, as opposed to a continuous N-doped region, the combined interface area between the N-doped strip portions and the underlying epitaxial silicon layer is reduced. However, more interface area is provided between the N-doped strip portions and the P-doped strip portions. A circuit simulation indicates that junction capacitance per unit peripheral length is 0.41 fF/μm, while the junction capacitance per unit area is 0.19 fF/μm^2. Junction capacitance per unit peripheral length thus scales faster than junction capacitance per unit area.

12 Claims, 5 Drawing Sheets

INTRINSIC DECOUPLING CAPACITOR

BACKGROUND OF THE INVENTION

1. Field of the Invention

This invention relates generally to a semiconductor structure and, more specifically, to an intrinsic capacitor forming part of the semiconductor structure.

2. Discussion of Related Art

Power consumption of microprocessors, chipsets, communication chips, and other semiconductor products continues to increase. In the power delivery loop, both for core and input/output power, there is impedance consisting of parasitic inductance, capacitance and resistance associated with the printed circuit board, package, and on-chip power grid. Due to impedance associated with the power delivery loop, any current through the loop will cause a drop, or "droop," in voltage available to the die. This drop in voltage at the die directly impacts the performance of the chip.

BRIEF DESCRIPTION OF THE DRAWINGS

The invention is described by way of examples with reference to the accompanying drawings, wherein.

DETAILED DESCRIPTION OF THE INVENTION

Figure 1:
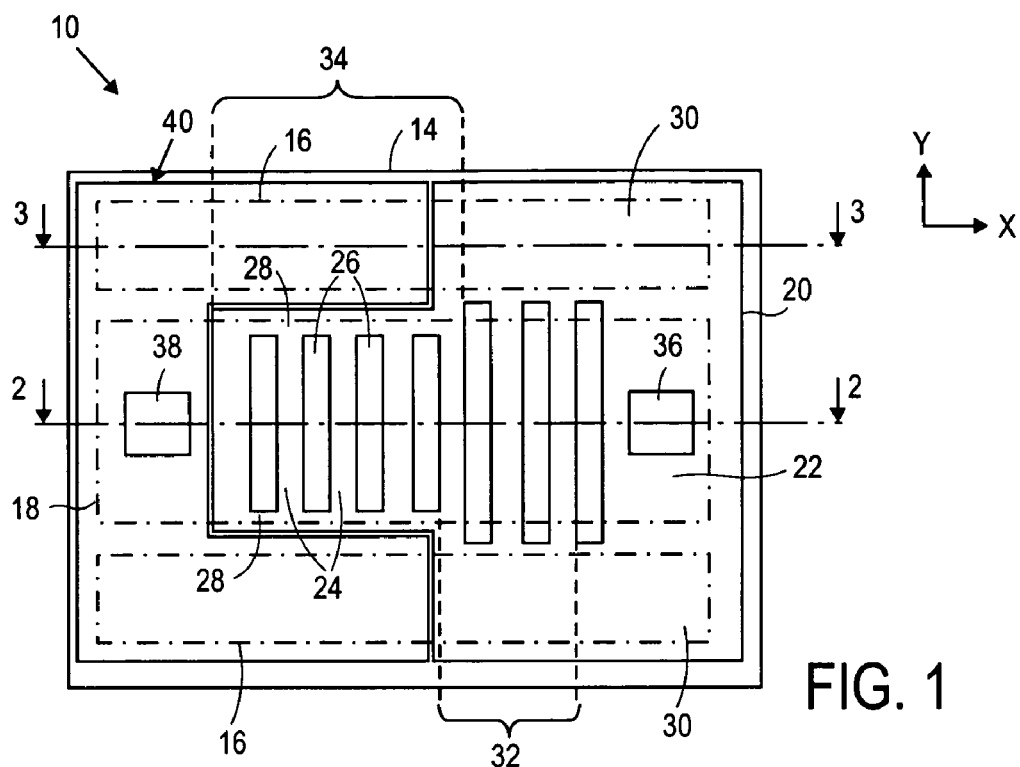
FIG. 1 is a top plan view of a semiconductor structure according to an embodiment of the invention.
Figure 2:
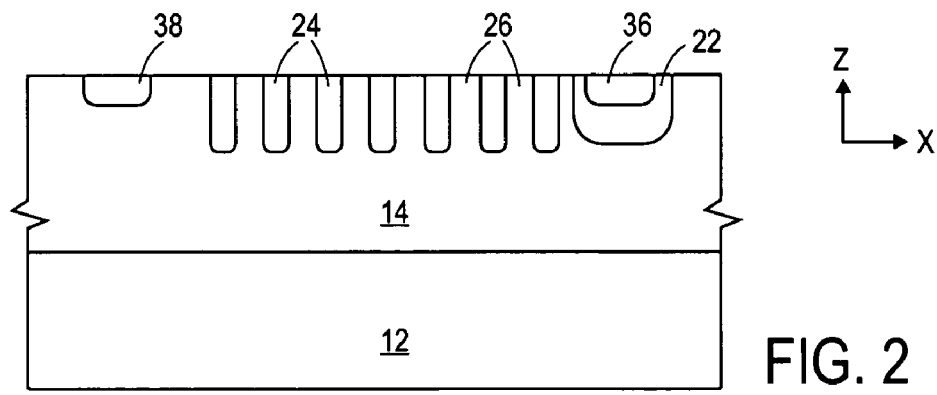
FIG. 2 is a cross-sectional view on 2-2 in FIG. 1.
Figure 3:
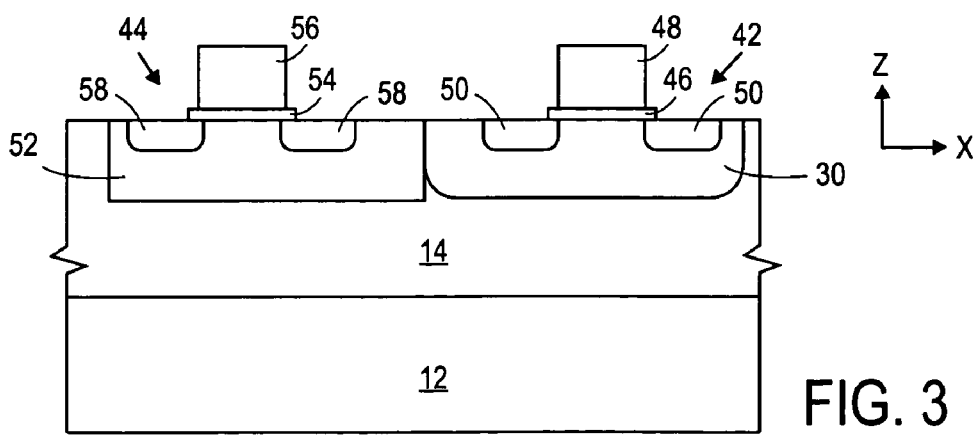
FIG. 3 is a cross-section view on 3-3 in FIG. 1.

FIGS. 1, 2, and 3 of the accompanying drawings illustrate the manufacture of a semiconductor structure 10 according to an embodiment of the invention. The semiconductor structure 10 is formed during wafer fabrication on a monocrystalline silicon wafer 12 having a P++ dopant concentration.

As illustrated in FIG. 2, an epitaxial silicon layer 14 is grown on the silicon wafer 12. The epitaxial silicon layer 14 has a P-conductivity type. As illustrated in FIG. 1, the epitaxial silicon layer 14 has two standard cell regions 16 and a filler cell region 18 between the standard cell regions 16.

A P-well layer 40 is formed in the epitaxial silicon layer 14. An N-well 20 is subsequently formed in the epitaxial silicon layer 14. The N-well 20 is formed by first forming a mask over the epitaxial silicon layer 14, and subsequently implanting ions into exposed areas of the epitaxial silicon layer 14.

Referring to FIGS. 1 and 2 in combination, the N-well 20 has a land region 22 and plurality of strip portions 24 formed in a portion of the epitaxial silicon layer 14 on the filler cell region 18. P-doped strip portions 26 (P-well) of the epitaxial silicon layer 14 remain between the N-doped strip portions 24 (N-well). The N-doped strip portions 24 thus alternate with the P-doped strip portions 26. Two N-doped strip portions 24 are located with sides adjacent opposing sides of each P-doped strip portion 26.

When a voltage is applied to the N-doped strip portions 24, a capacitance is created between the N-doped strip portions 24 and the P-doped strip portions 26. A capacitance is also created between the N-doped strip portions 24 and the underlying epitaxial silicon layer 14. A larger interface area between N-doped and P-doped regions generally increases the capacitance. By providing the N-doped strip portions 24, as opposed to a continuous N-doped region, the combined interface area between the N-doped strip portions 24 and the underlying epitaxial silicon layer 14 is reduced. However, more interface area is provided between the N-doped strip portions 24 and the P-doped strip portions 26. A circuit simulation indicates that junction capacitance per unit peripheral length is 0.41 fF/µm, while the junction capacitance per unit area is 0.19 fF/µm^2. Junction capacitance per unit peripheral length thus scales faster than junction capacitance per unit area.

Referring specifically to FIG. 1, the N-well 20 also has distal linking portions 28 and proximal linking portions 30. The proximal linking portions 30 are formed on proximal portions of the standard cell regions 16. The proximal linking portions 30 connect the land region 22 and ends of a first set 32 of the N-doped strip portions 24 to one another. The distal linking portions 28 connect ends of a second set 34 of the N-doped strip portions 24 to one another. The first and second sets 32 and 34 have one N-doped strip portion 24 in common, so that the first and second sets 32 and 34 are connected to one another.

Referring to FIGS. 1 and 2 in combination, an N-well tap 36 and a P-well tap 38 are formed respectively in the land region 22 and in the P-well layer 40. The N-well tap 36 is doped N+, and thus has a larger N-type conductivity concentration than the N-well 20. The P-well tap 38 is doped P+, and thus has a larger P-type conductivity concentration than the P-well layer 40. During further processing, conductive metal contacts are formed on the taps 36 and 38, and conductive metal lines are connected to the contacts. The N-well tap 36 is connected to power (Vdd), and the P-well tap 38 is connected to ground (Gnd). The P-doped strip portions 26 are connected through the underlying epitaxial silicon layer 14 to the P-well tap 38, and are thus at ground reference voltage. The N-doped strip portions 24 are connected through the proximal and distal linking sections 30 and 28 respectively, and through the land region 22 to the N-well tap 36, and are thus at the voltage of the N-well tap 36. A voltage potential is so created between the N-doped strip portions 24 and the P-doped strip portions 26, and a capacitance is formed between the N-doped strip portions 24 and the P-doped strip portions 26.

FIG. 3 illustrates that transistors 42 and 44 are formed over one of the standard cell regions 16. The transistor 42 is a PMOS transistor 42 which is formed in one of the proximal linking portions 30. The PMOS transistor 42 conventionally has a gate dielectric layer 46, a gate electrode 48 on the gate dielectric layer 46, and P-doped source and drain regions 50 on opposing sides of the gate electrode 48.

The transistor 44 is an NMOS transistor. A P-well 52 is formed in the epitaxial silicon layer 14. With reference to FIG. 1, the P-well is formed over the standard cell region 16 adjacent the second set 34 of N-doped strip portions 24. With further reference to FIG. 3, the NMOS transistor 44 conventionally has a gate dielectric layer 54, a gate electrode 56 on the gate dielectric layer 54, and N-doped source and drain regions 58 on opposing sides of the gate electrode 56.

Referring again to FIG. 1, four transistors are formed in the transistor semiconductor structure 10. A respective PMOS transistor is formed in each one of the proximal linking portions 30, and a respective NMOS transistor is formed on opposing sides of the second set 34 of N-doped strip portions 24.

Figure 4:
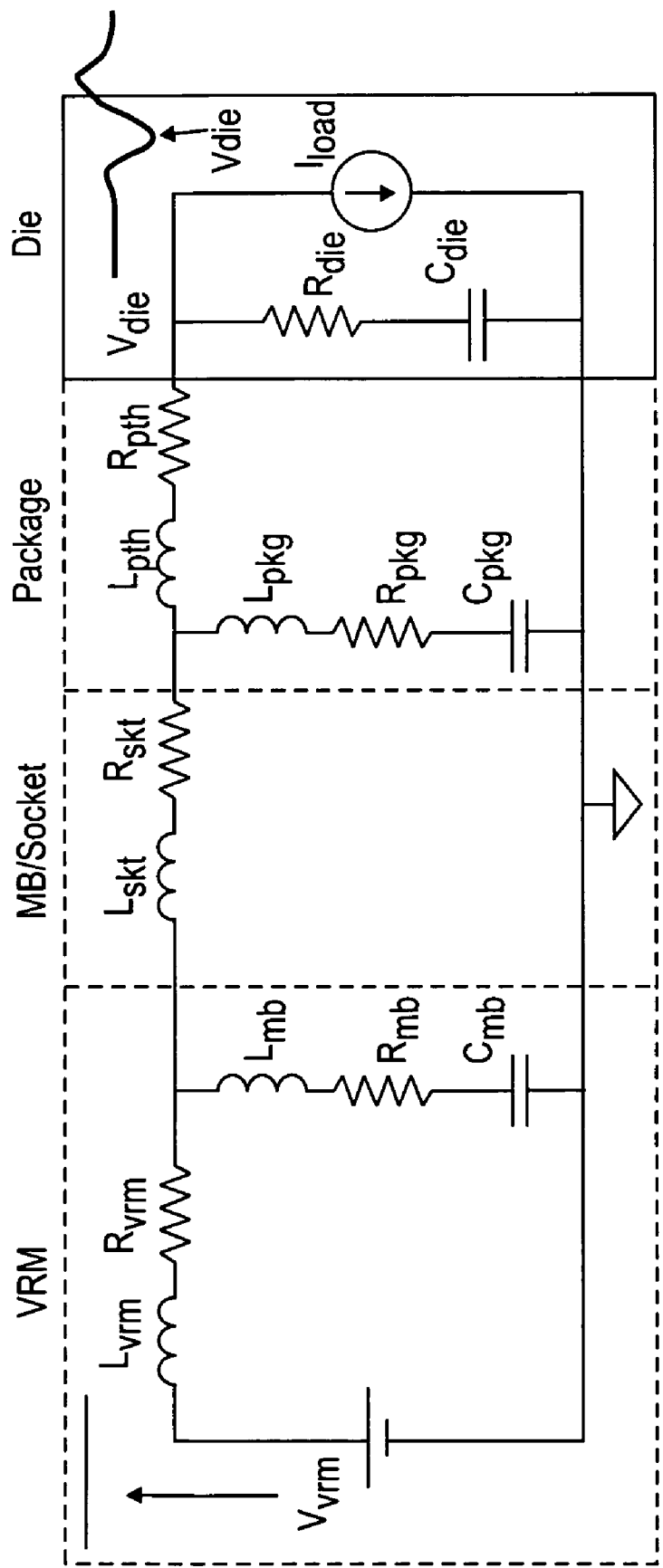
FIG. 4 is a circuit diagram of a computer assembly incorporating the semiconductor structure of FIG. 1.

FIG. 4 illustrates components of a computer assembly that includes the semiconductor structure 10 of FIG. 1. The semiconductor structure 10 forms part of an integrated circuit in a die. The die is mounted to a package. The package is attached to a socket on a motherboard. Decoupling capacitors are located on the motherboard (Cmb) on the package (Cpkg) and, as hereinbefore described, on the die (Cdie). The decoupling capacitors on the motherboard reduce second and third voltage droop, those on the package are used to reduce first and second voltage droop, and those on the die are primarily to reduce first voltage droop because they are located closest to the electronic circuit on the die and can thus deliver charges to the electronic circuit quickly when required.

Figure 5:
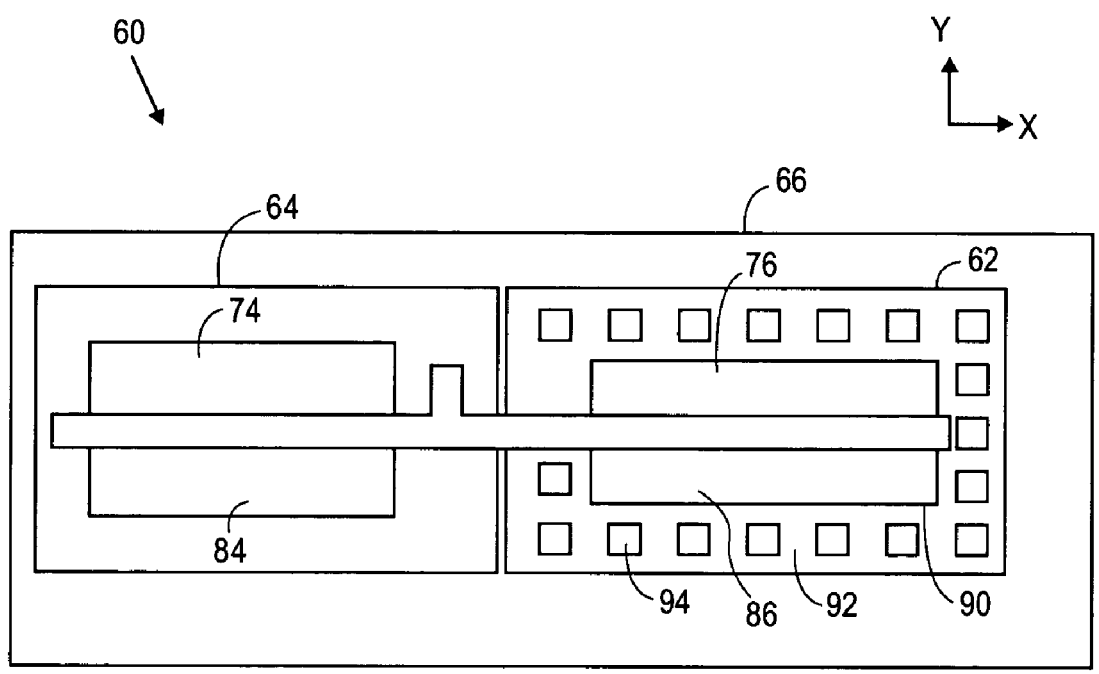
FIG. 5 is a top plan view of an inverter circuit according to an embodiment of the invention.
Figure 6:
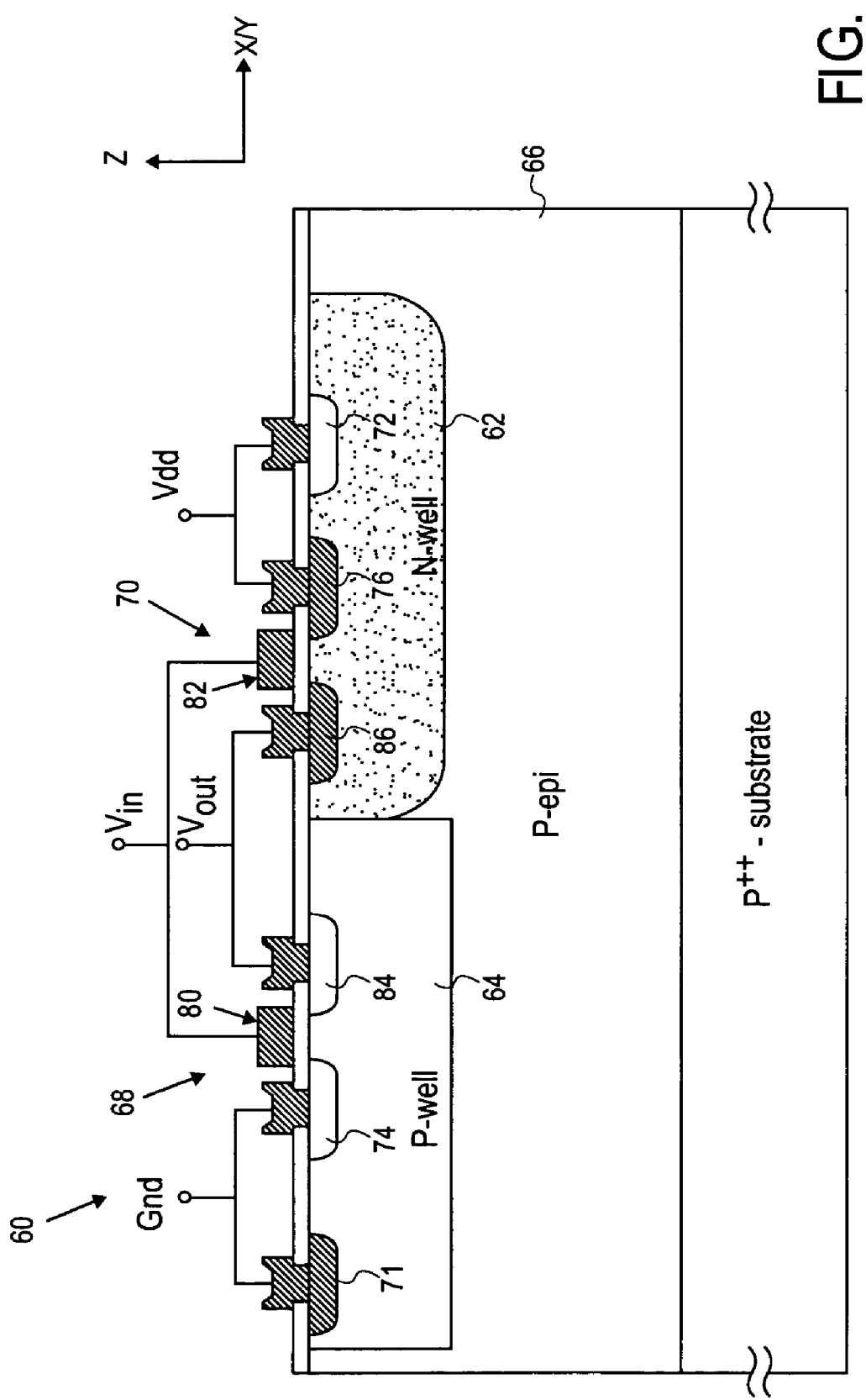
FIG. 6 is a cross-sectional side view of the inverter circuit, illustrating transistors, that are in reality in a side-by-side relationship, illustratively in an end-to-end relationship.

FIGS. 5 and 6 illustrate an inverter circuit 60 that includes the principles hereinbefore described. The inverter circuit 60 has an N-well 62 and a P-well 64 formed in an epitaxial silicon layer 66 on a P++-doped silicon substrate. An NMOS transistor 68 is formed in the P-well 64, and a PMOS transistor 70 is formed in the N-well 62. A P-well tap 71 is formed in the P-well 64, and an N-well tap 72 is formed in the N-well 62. A ground circuit (Gnd) is connected to contacts on the P-well tap 71 and one source/drain region 74 of the NMOS transistor 68. A power circuit (Vdd) is connected to contacts on the N-well tap 72 and one source/drain region 76 of the PMOS transistor 70. A signal circuit (Vin) is connected to gate electrodes 80 and 82 of the NMOS and PMOS transistors 68 and 70, respectively. Another signal circuit (Vout) is connected to contacts on source/drain regions 84 and 86 of the NMOS and PMOS transistors 68 and 70, respectively.

With specific reference to FIG. 5, the N-well 62 has an inner region $P^+$-doped0 layer 90 and an outer region N-well layer 92. The source/drain regions 76 and 86 are formed in the inner region 90. During ionization, the outer region 92 is masked so that P-doped regions 94 remain in the outer region 92. An increased capacitance is provided by the additional peripheral length between the N-well layer 92 and the P-doped regions 94.

Figure 7:
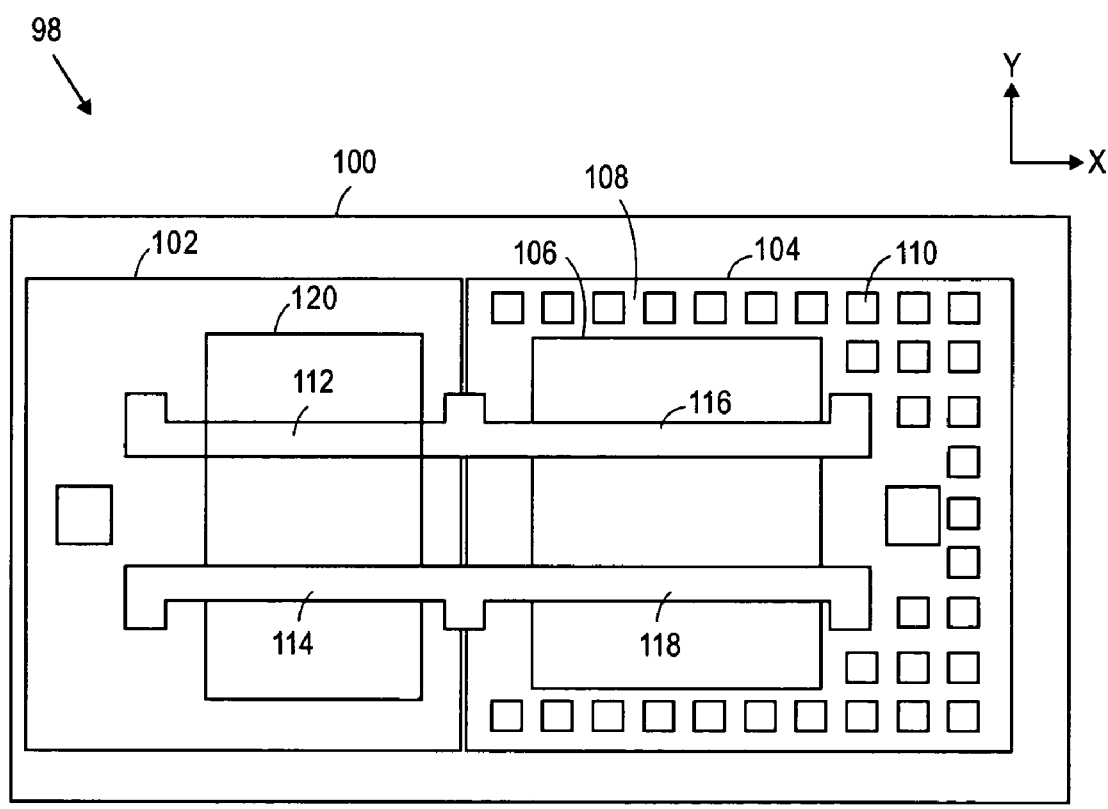
FIG. 7 is a top plan view of a bonus cell according to an embodiment of the invention.

FIG. 7 illustrates a bonus cell 98 that also incorporates the principles hereinbefore described. The bonus cell 98 has a P-doped epitaxial silicon layer 100 on a P++ wafer. A P-well 102 and an N-well 104 are formed in the epitaxial silicon layer 100. The N-well 104 has an inner region $P^+$-doped layer 106 and an outer region N-well layer 108. P-doped P-well regions 110 remain in the outer region 108. Conductors form two gate electrodes 112 and 114 on the $N^+$-doped layer 120, and two gate electrodes 116 and 118 on the inner region $P^+$-doped layer 106 of the N-well 104. Three $N^+$-doped regions can be formed in the P-well 102, with one of the $N^+$-doped regions between the gate electrodes 112 and 114, and the other two $N^+$-doped regions on outsides of the gate electrodes 112 and 114. Similarly, $P^+$-doped regions can be formed in the inner region 106 of the N-well 104, with one of the $P^+$-doped regions between the gate electrodes 116 and 118 and the other two $P^+$-doped regions outside the gate electrodes 116 and 118.

With specific reference to FIG. 7, the N-well 104 has an inner region $P^+$-doped layer 106 and an outer region N-well layer 108. During ionization, the outer region 108 is masked so that P-doped regions 110 remain in the outer region 108. An increased capacitance is provided by the additional peripheral length between the N-well layer 108 and the P-doped regions 110.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A semiconductor structure, comprising:
   at least one P-doped region;
   an N-well having at least two opposing portions with sides adjacent opposing sides of the P-doped region, and a linking section connecting the opposing portions to one another;
   an N-well tap in the N-well, having a higher N-type conductivity concentration than the N-well;
   a first conductive contact formed on the N-well tap; and
   a first conductor connected to the first conductive contact to provide a voltage potential to the N-well region and a capacitance between the N-doped portions and the P-doped region.

2. The semiconductor structure of claim 1, further comprising a P-doped epitaxial layer, a P-well, the P-doped region being connected through the P-doped epitaxial layer to the P-well, a P-well tap in the P-well having a higher P-type conductivity concentration than the P-well, a conductive contact formed on the P-well tap, and a second conductor connected to the second contact to provide ground to the second contact.

3. A semiconductor structure, comprising:
   a substrate;
   a P-doped epitaxial layer formed over the substrate, the epitaxial layer having filler cell and standard cell regions;
   a plurality of P-doped regions on the filler cell region;
   a plurality of N-doped portions on the filler cell region and alternating with the P-doped regions;
   an N-doped distal linking portion on the filler cell region and connecting a first set of the N-doped portions to one another;
   a P-doped region on the standard cell region adjacent the first set;
   an N-doped proximal linking portion on the standard cell region and connecting a second set of the N-doped portions to one another, the N-doped portions, the N-doped distal linking portion, and the N-doped proximal linking portion jointly forming an N-doped region; and
   a conductor connected to the N-doped region to provide a voltage potential to the N-doped region and a capacitance between the N-doped portions and the P-doped regions.

4. The semiconductor structure of claim 3, further comprising two transistors formed in the P-doped region and the N-doped proximal portion, respectively, over the standard cell region.

5. The semiconductor structure of claim 3, wherein the N-doped region is an N-well, further comprising an N-well tap in the N-well, having a higher N-type conductivity concentration than the N-well, a first conductive contact formed on the N-well tap, the first conductor being connected to the first contact, a P-doped epitaxial layer, a P-well, the P-doped region being connected through the P-doped epitaxial layer to the P-well, a P-well tap in the P-well having a higher P-type conductivity concentration than the P-well, a conductive contact formed on the P-well tap, and a second conductor connected to the second contact to provide ground to the second contact.

6. An inverter circuit, comprising:
a P-well;
an NMOS transistor formed in and on the P-well;
an N-well having an inner region and an outer region;
a PMOS transistor formed in and on the inner region;
a plurality of P-doped regions in the outer region;
a ground circuit connected to the P-well and a source/drain region of the NMOS transistor;
a power circuit connected to the N-well and a source/drain region of the PMOS transistor;
a Vin circuit connected to a gate of the PMOS transistor and a gate of the NMOS transistor; and
a Vout circuit connected to a source/drain region of the PMOS and a source/drain region of the NMOS transistor.

7. The inverter circuit of claim 6, wherein the P-doped regions are located between the P-well and the NMOS transistor.

8. The inverter circuit of claim 6, wherein the P-doped regions completely surround the NMOS transistor.

9. The inverter circuit of claim 6, wherein the N-doped region leaves a plurality of P-doped regions, and the N-doped region has a plurality of portions alternating with the P-doped regions.

10. A bonus cell, comprising:
a P-well;
two gate electrodes formed on the P-well;
three N-diffusion regions formed in the P-well respectively between and outside the gate electrodes on the P-well;
an N-well adjacent the P-well, the N-well having inner and outer regions;
a plurality of P-doped regions in the outer region;
two gate electrodes formed on the N-well; and
three P-diffusion regions formed in the inner regions respectively between and outside the gate electrodes on the N-well.

11. The bonus cell of claim 10, further comprising an N-well tap in the N-well having a higher N-type conductivity concentration than the N-well, and a first conductive contact formed on the N-well tap.

12. The bonus cell of claim 11, further comprising a P-well tap in the P-well having a higher P-type conductivity concentration than the P-well, and a second conductive contact formed on the P-well tap.

* * * * *